(12) United States Patent
Koberg et al.

(10) Patent No.: US 7,997,198 B2
(45) Date of Patent: Aug. 16, 2011

(54) PLATE DRUM LOADABLE AS A SLEEVE FOR AN IMAGING DEVICE

(75) Inventors: Jörg Koberg, Hohenwestedt (DE); Stefan Wellendorf, Kiel (DE); Jörg Wolterink, Oelixdorf (DE); Pascal F. M. Thomas, Hamburg (DE)

(73) Assignee: Esko-Graphics Imaging GmbH, Itzehoe (DE)

( * ) Notice: Subject to any disclaimer, the term of this patent is extended or adjusted under 35 U.S.C. 154(b) by 277 days.

(21) Appl. No.: 11/539,997

(22) Filed: Oct. 10, 2006

(65) Prior Publication Data

US 2008/0141883 A1 Jun. 19, 2008

(51) Int. Cl.
*B41C 3/08* (2006.01)
*B41N 6/00* (2006.01)
*B41F 13/10* (2006.01)
*B41F 27/06* (2006.01)

(52) U.S. Cl. .................................. 101/401.1; 101/378
(58) Field of Classification Search ............... 101/401.1, 101/375, 378, 382.1, 383, 389.1
See application file for complete search history.

(56) References Cited

U.S. PATENT DOCUMENTS

| 4,144,813 | A | * | 3/1979 | Julian | 101/382.1 |
| 4,856,428 | A | * | 8/1989 | Green et al. | 101/475 |
| 5,383,001 | A | * | 1/1995 | Bosy | 355/73 |
| 5,711,222 | A | * | 1/1998 | Taylor et al. | 101/383 |
| 5,760,880 | A | | 6/1998 | Fan et al. | 355/67 |
| 5,782,181 | A | | 7/1998 | Rossini | 101/153 |
| 5,819,657 | A | | 10/1998 | Rossini | 101/376 |
| 6,074,056 | A | * | 6/2000 | Kubo et al. | 347/104 |
| 6,142,073 | A | | 11/2000 | Zeman et al. | 101/216 |
| 6,259,873 | B1 | | 7/2001 | Shifley et al. | 399/110 |
| 6,321,651 | B1 | * | 11/2001 | Tice et al. | 101/248 |
| 6,394,943 | B1 | | 5/2002 | Cormier et al. | 492/47 |
| 6,467,409 | B2 | | 10/2002 | Busshoff | 101/375 |
| 6,779,450 | B1 | * | 8/2004 | Vieira et al. | 101/375 |
| 6,799,510 | B2 | | 10/2004 | Sandstrom | 101/375 |
| 6,945,169 | B2 | * | 9/2005 | Gottling et al. | 101/248 |
| 7,124,685 | B2 | * | 10/2006 | Re et al. | 101/375 |
| 7,255,042 | B2 | * | 8/2007 | Sasaki | 101/425 |
| 2002/0023562 | A1 | | 2/2002 | Busshoff | 101/376 |
| 2004/0114191 | A1 | * | 6/2004 | Salvestro | 358/3.29 |
| 2005/0111877 | A1 | | 5/2005 | Cormier et al. | 399/109 |

(Continued)

FOREIGN PATENT DOCUMENTS

DE 22 27 465 1/1973

(Continued)

OTHER PUBLICATIONS

"Digital Workflow," Downloaded Sep. 8, 2006 from Dupont at: http://www2.dupont.com/Packaging_Graphics/en_US/products/digital_wkflow/index.html.

(Continued)

*Primary Examiner* — Daniel J Colilla
*Assistant Examiner* — Leo T Hinze
(74) *Attorney, Agent, or Firm* — Dov Rosenfeld; Inventek

(57) ABSTRACT

A cylindrically-shaped tube fitting over a cylindrically-shaped base body rotatable around an axis of rotation. The tube has a cylindrically-shaped inner surface defining a hollow region, a cylindrically-shaped outer surface, a first end, and a second end. The base body is arranged to fit either a sleeve or the tube. The outer surface includes vacuum grooves or a plate clamping system or both, and arranged to secure a flexible sheet of material around the outer surface of the tube.

16 Claims, 9 Drawing Sheets

U.S. PATENT DOCUMENTS

2008/0110357 A1* 5/2008 Andresen et al. .......... 101/401.1

FOREIGN PATENT DOCUMENTS

| EP | 0 614 125 | 9/1994 |
|---|---|---|
| GB | 2 367 786 | 4/2002 |
| WO | WO 2006/130601 | 12/2006 |

OTHER PUBLICATIONS

"Esko-Graphics CDI Compact 4835—Digital flexo for high quality and speed," Esko-Graphics, Gent, Belgium, Downloaded Sep. 9, 2006. Available online at: http://www2.dupont.com/Packaging_Graphics/en_US/assets/downloads/pdf/CDI_COMPACT_4835_DATASHEET.pdf.

Data Sheet, "CDI Spark 4835: Technical specifications," Esko-Graphics, Gent, Belgium, Downloaded Sep. 8, 2006. Available online at http://www.esko.com/webdocs/showdoc.asp?id=051125140121&type=doc&pdf=true.

Products,"Flexolaser piccolo," Flexolaser GmbH, Efringen-Kirchen, Germany, downloaded Sep. 8, 2006. Available online at: http://www.flexolaser.de/PDFs/piccolo.pdf.

"Laser Imagesetters for Computer-to-Plate Water-Wash Plates," Anderson & Vreeland Inc., Bryan, OH, downloaded Sep. 8, 2006 Available online at: http://www.andersonvreeland.com/PDFs/FlexoLaser.pdf.

Products,"Flexolaser medio," Flexolaser GmbH, Efringen-Kirchen, Germany, downloaded Sep. 8, 2006. Available online at: http://www.flexolaser.de/PDFs/Medio.pdf.

Products,"Flexolaser piccolino," Flexolaser GmbH, Efringen-Kirchen, Germany, downloaded Sep. 8, 2006. Available online at: http://www.flexolaser.de/PDFs/piccolino.pdf.

H/C Bridge Light Sleeve Brochure, "H/C Airo Light," Rotec North America, Fletcher, NC, downloaded Sep. 8, 2006. Available online at: http://www.dayintl.com/rotec/pdfs/HC%20Airo%20Light_030303.pdf.

H/C Bridge Light Sleeve Brochure, "H/C Bridge Light," Rotec North America, Fletcher, NC, downloaded Sep. 8, 2006. Available online at: http://www.dayintl.com/rotec/pdfs/HC%20Bridge%20Light_032003.pdf.

"Tips and Hints" Brochure, Rotec GmbH & Co. KG, Ahaus-Ottenstein, Germany, downloaded Sep. 8, 2006. Available online at: http://www.dayintl.com/rotec/pdfs/Tips%20round%20GB%20A3%20Hoch%20r.pdf.

"Product Overview" Brochure, Rotec North America, Fletcher, NC, downloaded Sep. 8, 2006. Available online at: http://www.dayintl.com/rotec/pdfs/ProdOvrvw.pdf.

* cited by examiner

SECTION CC

PLATE DRUM LOADABLE AS A SLEEVE FOR AN IMAGING DEVICE

TECHNICAL FIELD

The present disclosure is generally related to printing devices.

BACKGROUND

Flexographic plates are frequently exposed from computer data using computer-to-plate (CTP, C2P) imaging. With sleeve imaging a sleeve with flexographic material pre-wrapped is mounted over a rotatable mandrel on the exposing device. With plate imaging, a flexographic plate is wrapped around a rotatable vacuum drum on the exposing device. Changing from sleeve imaging to plate imaging on a CTP flexo exposing device typically requires changing the mandrel for a vacuum drum. This changeover typically requires a crane or other auxiliary tool as drums and mandrels are heavy and cannot be transported by hand, e.g., by single operator.

What is needed is an apparatus that can avoid such changeover between mandrel and drum that allows for a mixed plate and sleeve workflow on the same imaging device.

SUMMARY

It is a general object of the present invention to provide a useful alternative to manually changing between a drum and sleeve for flexographic imaging.

Rather than a sleeve, which normally is placed on top of the carrier sleeve or directly on a base body forming a mandrel, a drum sleeve is used, which has the same physical characteristics as a drum, e.g., in one embodiment, vacuum grooves connectable to a vacuum supply, and in some embodiments, one or more clamping devices to hold flexographic plates in place.

One embodiment is an apparatus including a cylindrically-shaped tube—called a drum sleeve herein—adapted to fit over a generally cylindrically-shaped base body rotatable around an axis of rotation. The tube has a generally cylindrically-shaped inner surface defining a hollow region, a cylindrically-shaped outer surface, a first end, and a second end. The tube is securable on the base body such that the combination of the base body and tube is rotatable around the axis of rotation. The tube further includes one or more mechanisms around the outer surface of the tube arranged to secure a flexible sheet of material wrapped around the outer surface of the tube, the tube configured such that after the tube is secured on the base body and the sheet is secured on the outer surface of the tube, the tube, base body, and sheet combination is rotatable and the sheet can be exposed by an exposing mechanism in the case that the base body is part of a drum imager that includes the exposing mechanism and the sheet is a sensitized sheet for exposing, or scanned by a scanning mechanism in the case that the base body is part of a drum scanner that includes the scanning mechanism and the sheet is a sheet for scanning.

In one embodiment, the inner surface is made of an expandable material, such that the tube can be mounted onto the base body or unmounted from the base body when air pressure is applied from the base body, and, once mounted on the base body, secured onto the base body by removal of the air pressure.

In one embodiment, the one or more mechanisms around the outer surface of the cylindrically shaped tube include vacuum grooves arranged to help maintain the sheet on the outer surface by applying suction to the vacuum grooves. In one example, the vacuum grooves include longitudinal grooves extending longitudinally along the outer surface of the tube.

In one embodiment, the one or more mechanisms around the outer surface of the cylindrically shaped tube further include a clamp system that extends longitudinally, and that is operable to clamp an end of the sheet onto the outer surface of the tube.

One embodiment is the base body adapted such that the drum sleeve can be mounted thereon.

One embodiment is the combination of the base body and the drum sleeve.

Particular embodiments may provide all, some, or none of these aspects, features, or advantages. Particular embodiments may provide one or more other aspects, features, or advantages, one or more of which may be readily apparent to a person skilled in the art from the figures, descriptions, and claims herein.

DETAILED DESCRIPTION

In a typical flexographic plate exposing process, flexographic plate material is attached to the outside surface of a cylinder for exposure, and as the cylinder rotates, the plate material is exposed, e.g., using a modulated laser beam. In one workflow, the plate material is provided in the form of a sleeve whose outer surface includes the material. The sleeve is mounted onto a cylinder called a mandrel, and the combination exposed in an exposure unit in which the mandrel and sleeve are rotated while one or more laser beams, modulated according to imaging data, move in a longitudinal direction parallel to the axis of rotation of the mandrel. One sleeve example includes an expandable inner surface. The sleeve is thus expandable by air pressure for mounting and demounting onto the mandrel. In a second workflow a printing plate is mounted on a drum, e.g., using tape, and/or vacuum and/or clamping devices.

Embodiments of the present invention include a base body onto which a drum sleeve is mounted in the same manner as for sleeve imaging. The drum sleeve is a cylindrically-shaped tube having a generally cylindrically-shaped inner surface defining a hollow internal region, a cylindrically-shaped outer surface, a first end, and a second end. The drum sleeve includes one or more mechanisms around the outer surface of the tube arranged to secure a flexible sheet of material wrapped around the outer surface of the drum sleeve. The combination of the drum sleeve and the base body forms a drum that is rotatable. Plate material is wrapped around the outer surface drum sleeve. The combination is rotated for exposing the plate material. This avoids the mounting and dismounting of mandrels and drums when changing between sleeve and plate imaging.

When a plate is mounted in the drum sleeve, the tube, base body, and sheet combination is rotatable and the plate can be exposed by an exposing mechanism in the case that the base body is part of a drum imager that includes the exposing mechanism and the plate is a sensitized plate for exposing, or scanned by a scanning mechanism in the case that the base body is part of a drum scanner that includes the scanning mechanism and the plate is a plate for scanning.

The remainder of the description will be in terms of an apparatus for use in a flexographic drum imager e.g., the CDI made by Esko-Graphics, NV of Belgium. Those in the art will understand that embodiments may be used in different applications.

Figure 1A:
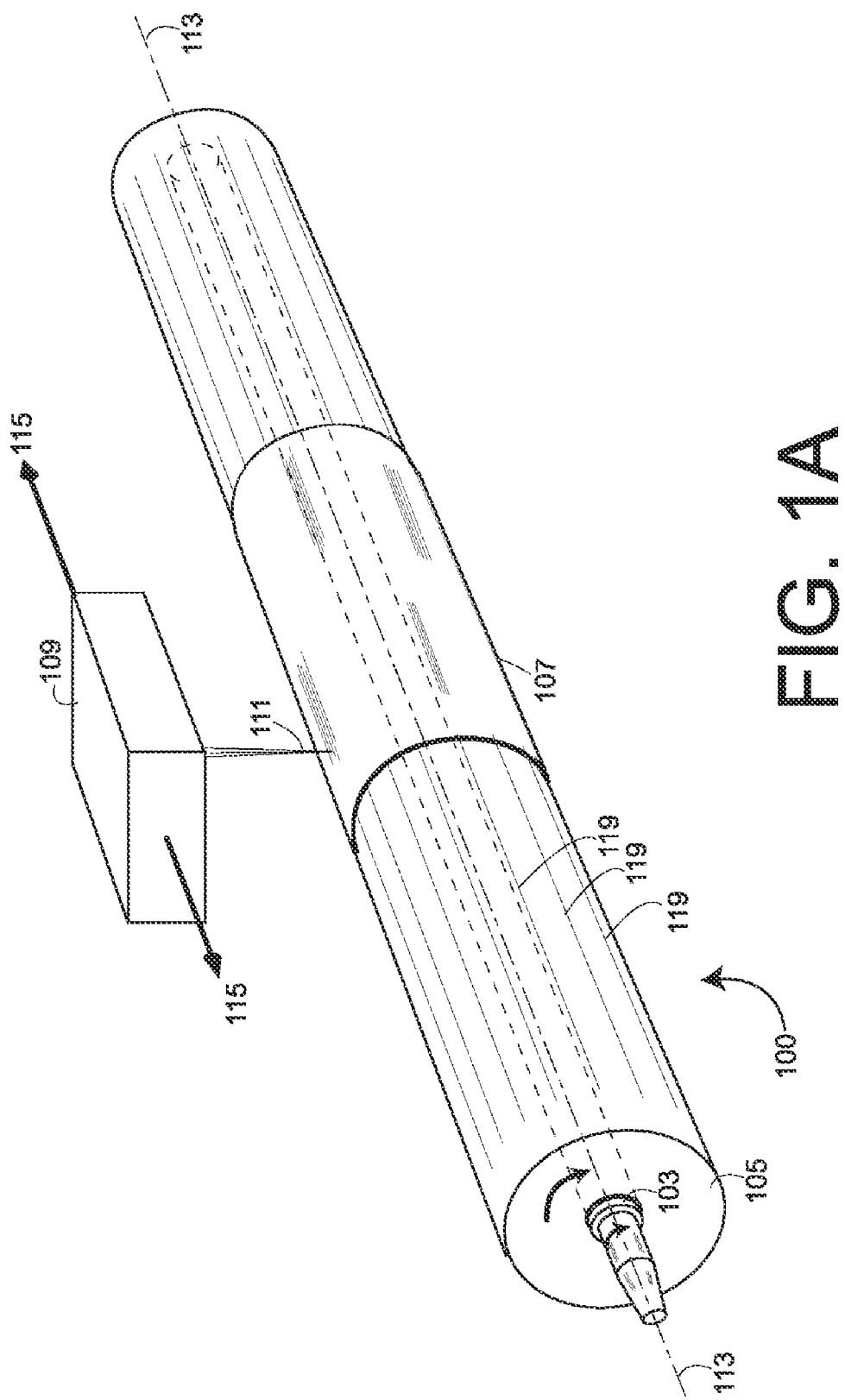
FIG. 1A shows in simplified form a perspective view of one embodiment of a combination of a cylindrically shaped base body and a drum sleeve mounted thereon.

FIG. 1A shows in simplified form a perspective view of one embodiment of a combination 100 of a cylindrically shaped base body 103 and a drum sleeve 105 mounted thereon, rotating about an axis 113. The drum sleeve has a plate 107 wrapped around the surface. FIG. 1A shows the combination 100 rotating in an example image exposing apparatus, e.g., a computer-to-plate exposing system that includes in addition to the combination 100, a laser and optical system, shown in simplified form as 109, generating a laser beam 111 that is modulated by image data provided by a computer (not shown). Many of the elements of the image exposing apparatus are not included in order to simplify illustrating the combination 100. As the combination 100 is rapidly rotated with the plate 107 on the surface of the drum sleeve 105, the laser beam generates exposed circumferential lines in the transverse direction perpendicular to the direction of the axis 113 of rotation. At the same time in one embodiment, the laser beam moves in the longitudinal direction 115 parallel to the axis of rotation 113. Such exposing is commonly known for external drum scanners.

Figure 1B:
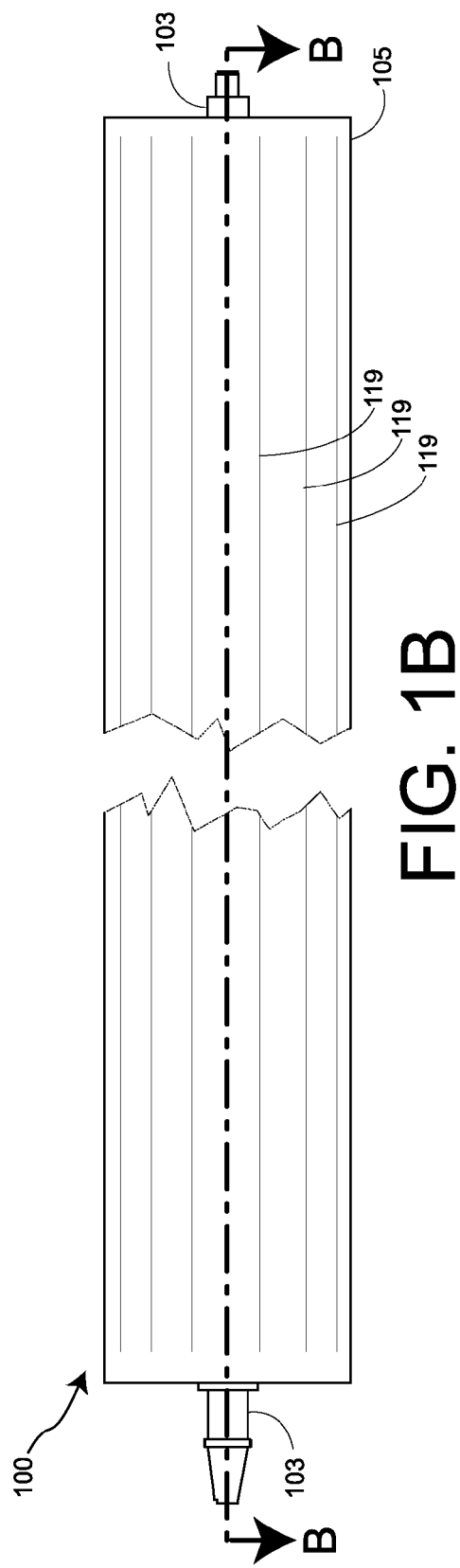
FIG. 1B shows a projection of the combination shown in FIG. 1A.

FIG. 1B shows a projection of the combination 100.

Figure 2:
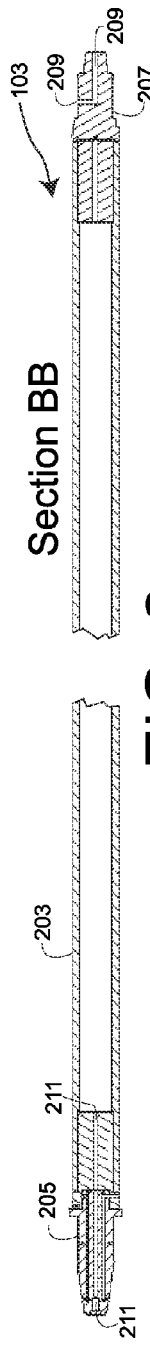
FIG. 2 shows the section marked BB in FIG. 1B of one embodiment of the cylindrically shaped base body.

FIG. 2 shows the section marked BB in FIG. 1B of one embodiment of the cylindrically shaped base body 103, which is configured for securely mounting a drum sleeve such as drum sleeve 105 thereon, or a print sleeve or carrier sleeve thereon, and for dismounting the drum sleeve (or print or carrier sleeve) therefrom. The base body 103 includes an outer surface 203 and first and second ends 205 and 207, respectively.

Figure 3:
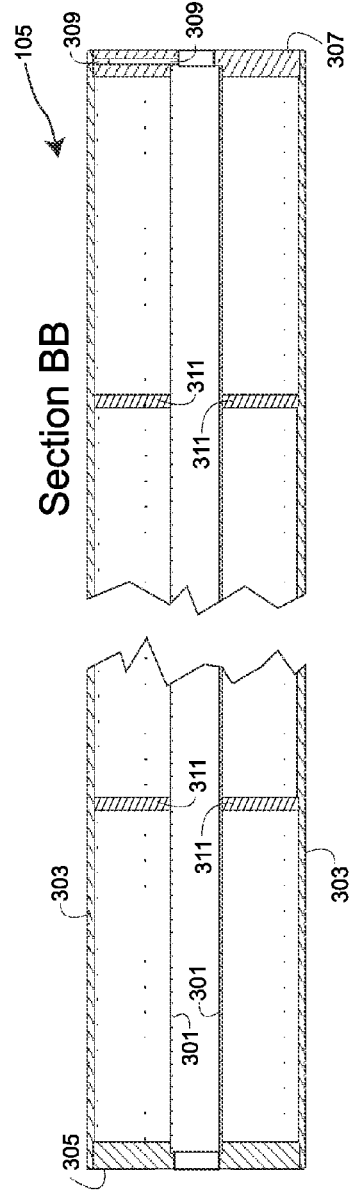
FIG. 3 shows the section marked BB in FIG. 1B of one embodiment of the drum sleeve.

FIG. 3 shows the section marked BB in FIG. 1B of one embodiment of the drum sleeve 105 that includes a cylindrically shaped hollow tube having an inner surface 301, an outer surface 303, and first and second ends 305 and 307, respectively. The inner surface 301 is configured to be mountable on the cylindrically shaped base body 103 shown in FIG. 2. The outer surface 303 is configured for fastening plates thereon for exposing in an image exposing apparatus as described above. One embodiment includes disks 311 to stabilize the drum sleeve.

Figure 4:
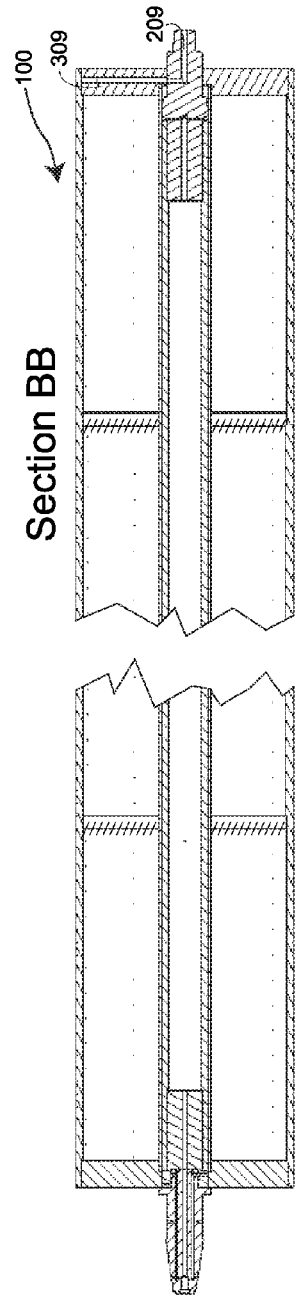
FIG. 4 shows the section marked BB in FIG. 1B of one embodiment of the combination of the base body and the drum sleeve.

FIG. 4 shows the section marked BB in FIG. 1B of one embodiment of the combination 100 of the base body 103 and the drum sleeve 105.

In one embodiment, mounting of a sleeve or the drum sleeve 105 is carried out by applying air pressure from the base body, e.g., using a compressed air system, and further, unmounting a sleeve or the drum sleeve 105 mounted on the base body 103 is also carried out when air pressure is applied from the base body using a compressed air system. In such an embodiment, the drum sleeve 105, once mounted on the base body 103, is secured onto the base body 103 by removal of the air pressure. In such an embodiment, the inside surface 301 of the drum sleeve is made of an expandable material.

The base body 103 includes a compressed air system to mount and dismount sleeves. The compressed air is applied at the first end 205 via a tubular passageway 211 connected to the inside of the base body and further to nozzles that are evenly spread on the outer surface 203 of the base body 103. The dimensions of the outside surface 203 of the base body and the inside surface 301 of the drum sleeve are matched, so that when air pressure is applied, the nozzles cause the inner surface of the sleeve or drum sleeve 105, e.g., inner surface 301 (FIG. 3) to slightly expand, to produce an air bearing such that the sleeve or drum sleeve can easily slide on and off the base body. Fixing the sleeve or drum sleeve onto the base body includes switching off the compressed air to cause the inner surface 301 to contract. Such a mechanism is common in the art, and, e.g., is commonly used for mounting sleeves and carrier sleeves, so details of how to construct such nozzles and the compressed air connection to the base body 103 would be known to those in the art, and therefore are not detailed further herein. Furthermore, use of an inner surface 301 made from an expandable material that slightly expands when air pressure is applied is common in the art, and, e.g., is commonly used for mounting sleeves and carrier sleeves, so details of how to construct such an inner surface would be known to those in the art, and therefore are not detailed further herein.

In one embodiment, the outer surface 303 of the cylindrically shaped tube of the drum sleeve 105 includes vacuum groves 119 that, in one version, are longitudinal, parallel to the axis of rotation 113, and evenly distributed circumferentially on the surface 303. Such grooves are shown in FIGS. 1A and 1B as grooves 119. In one embodiment, the vacuum grooves are about 1.2 mm wide and about 1 mm deep. The vacuum grooves are arranged to help maintain a plate on the outer surface by applying suction to the grooves.

In one embodiment, the drum sleeve has a length of about 210 cm and an outer diameter of about 411 mm. The inner hollow of the drum sleeve and the drum body have diameters that match of approximately 89 mm. In the case of mounting aided by compressed air, the diameter of the inner surface 301 of the drum sleeve 105 is made to fit tightly around the diameter of the base body 103, and is expandable by using the compressed air to aid in mounting and unmounting the drum sleeve. Of course, those in the art will understand that other embodiments have different dimensions.

Referring to FIG. 3, one end 307 of the drum sleeve 105 includes a set of tubular passageways—one such tubular passageway is shown as tubular passageway 309. Each tubular passageway 309 connects to a matching tubular passageway 209 of a set of matching tubular passageways in one end 207 of the base body 103 (see FIG. 2). Each of the tubular passageways 309 is connected to the vacuum grooves 119. FIG. 4 shows the section marked BB in FIG. 1B of the combination 100, illustrating how one tubular passageway, passageway 209 in the base body 103 is matched to a corresponding passageway 309 in the drum sleeve 105 when the drum sleeve 105 is properly mounted on base body 103. A vacuum pump (not shown in FIG. 4) is coupled to the base body end 207 and generates a vacuum in the grooves 119 via the passageways 209 and 309. The vacuum grooves 119 are configured, in operation, to maintain a plate, e.g., a flexographic plate fixed on the outer surface 303 of the drum sleeve. Note that there typically are more passageways 209, 309 than shown in the drawings, and only one set is shown in order not to obscure how the apparatus functions. Also note that such vacuum grooves are common in drums used today for mounting plates thereon, and those in the art would be familiar with such structures. Hence, details on their construction is left out of this disclosure.

One embodiment of the drum sleeve 105 is constructed using outer cylindrical tube whose outer surface is the outer surface 303, and an inner cylindrical tube whose inner surface provides the inner surface 301 that is made of an expandable material as is used in conventional sleeves that are mountable using air pressure. Disks 311 are perpendicular to the axis of rotation, and attached to the inner cylindrical tube for providing structural support to the drum sleeve 105. The end members 305 and 307 are attached to the inner and outer cylindrical tubes. The inside region between the outer cylindrical tube and the inner cylindrical tube, other than the disks 311 is essentially empty.

Figure 5A:
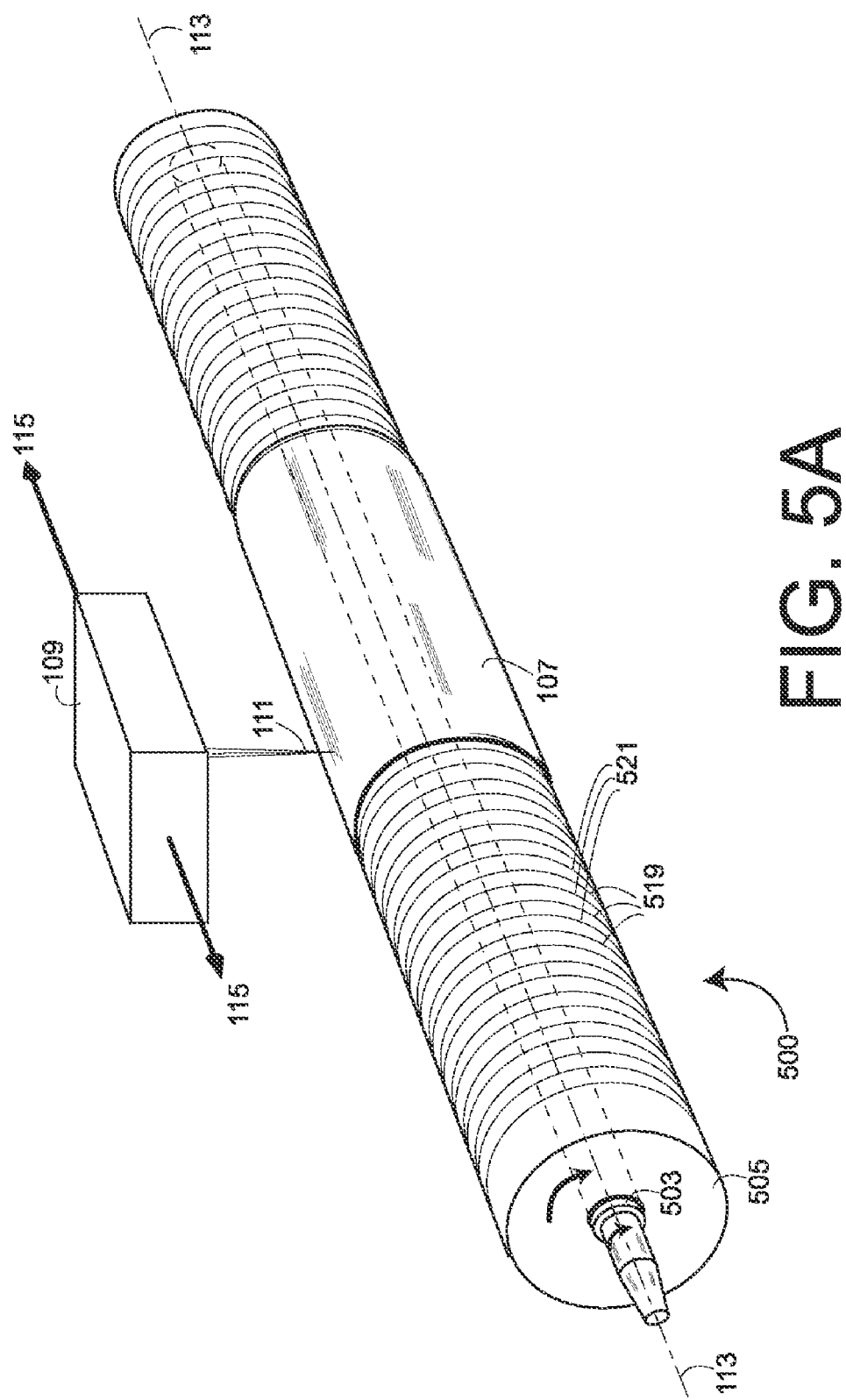
FIG. 5A shows in simplified form a perspective view of another embodiment of a combination of a different embodiment drum sleeve mounted on a base body.

FIG. 5A shows in simplified form a perspective view of another embodiment. Shown is a combination 500 of a different embodiment drum sleeve 505 mounted on a base body 503 that is almost the same as the base body 303, but that has slightly different ends adapted for use with the drum sleeve embodiment 505. The combination is shown rotating about the axis 113. The drum sleeve 505 has the plate 107 wrapped around the surface. As in FIG. 1A, the combination 500 is rotating in an example image exposing apparatus, e.g., a computer-to-plate exposing system that includes in addition to the combination 500, a laser and optical system, shown in simplified form as 109, generating a laser beam 111 that is modulated by image data provided by a computer (not shown).

The drum sleeve 505 is constructed differently than the embodiment 105 shown in FIGS. 2-4. The drum sleeve 505 is configured to fit over the cylindrical-shaped base body 503, which essentially is the same as the base body 103 of FIGS. 2 and 4, but that has slightly different ends to accommodate the details of the drum sleeve 505.

Figure 5B:
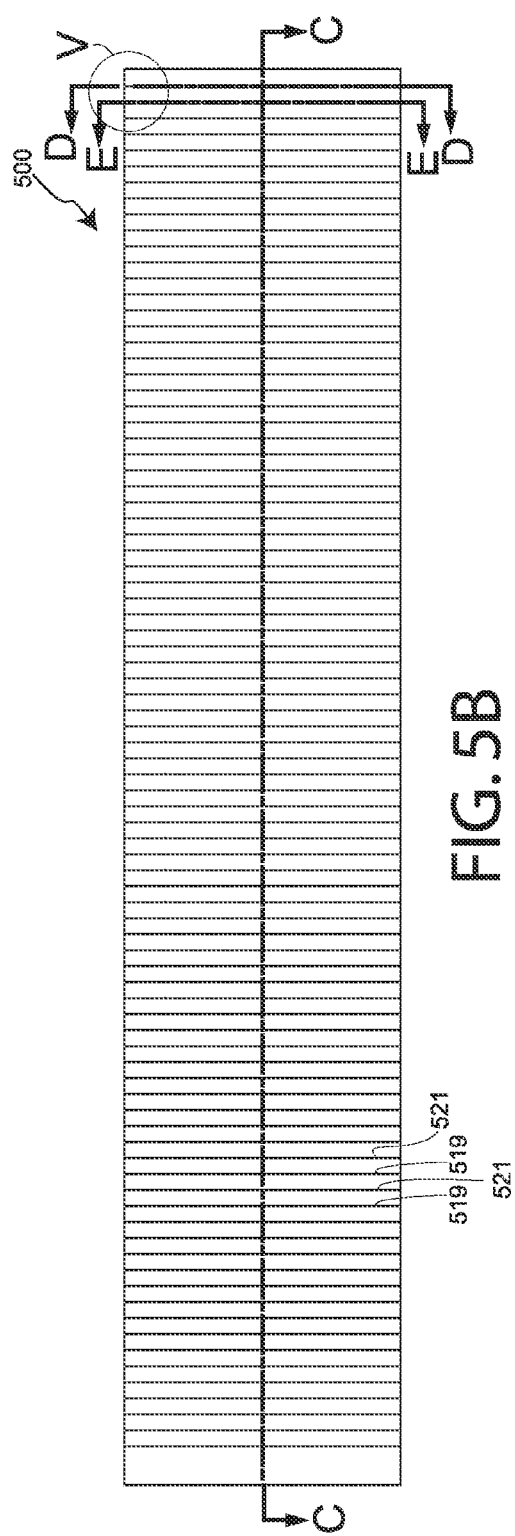
FIG. 5B shows a projection of the drum sleeve shown in FIG. 5A.
Figure 6A:
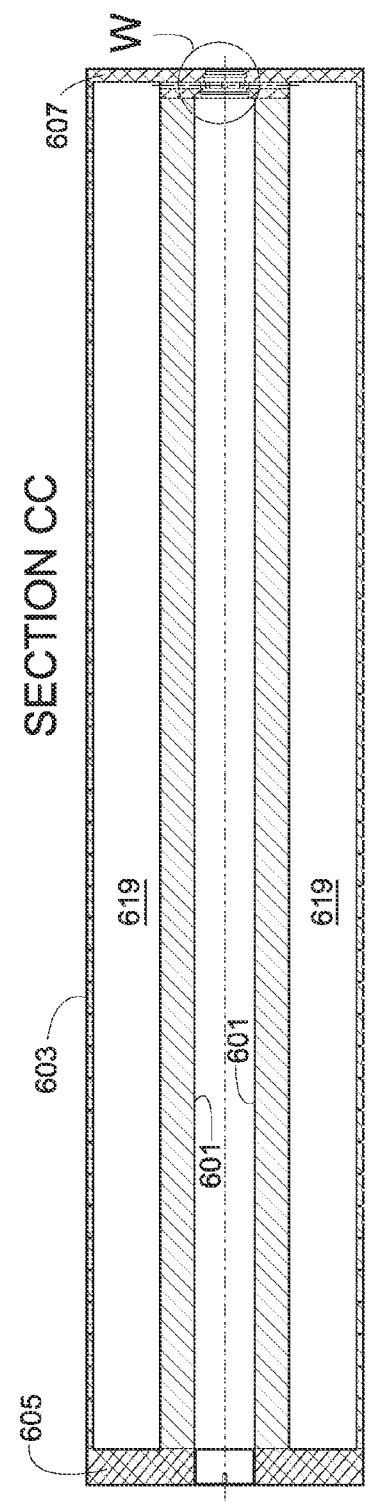
FIG. 6A shows the section marked CC in FIG. 5B of the drum sleeve.

FIG. 5B shows a projection of the drum sleeve 505. FIG. 6A shows the section marked CC in FIG. 5B of the drum sleeve 505.

Referring now to FIG. 6A, the drum sleeve 505 includes a cylindrically shaped outer surface 603 and a cylindrically shaped hollow with an inner surface 601. The drum sleeve 505 also includes first and second ends 605 and 607, respectively. The inner surface 601 is configured to be mountable on a cylindrically shaped base body 503 substantially the same as base body 103, but with different fittings at the end. The outer surface 603 is configured for fastening plates thereon for exposing in an image exposing apparatus as described above.

The drum sleeve outer surface 603 includes vacuum grooves that are adapted to hold or to aid holding one or more plates onto the outer surface 603 during exposure. In one embodiment, referring now to FIGS. 5A and 5B, the outer surface 603 includes a first set of vacuum grooves 519 and a second set of vacuum groves 521, with each groove forming a circular track around the circumference of outer surface 603 of the drum body 505. A groove 519 from the first set is followed by a groove 521 from the second set, so that the grooves 519 of the first set alternate with the grooves 521 of the second set.

Figure 6B:
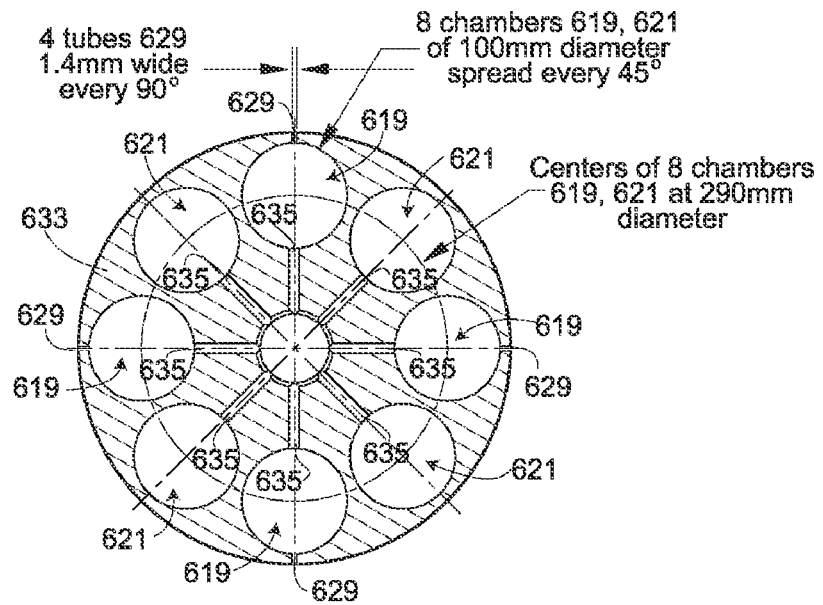
FIGS. 6B and 6C show the sections marked DD and EE, respectively, in FIG. 6A.
Figure 6C:
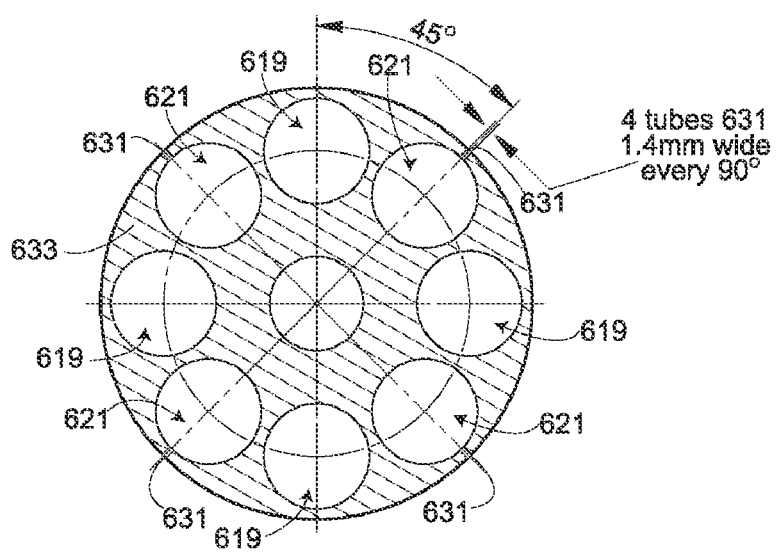

FIGS. 6B and 6C show the sections marked DD and EE, respectively, in FIG. 6A. Referring to FIGS. 6A, 6B, and 6C, the drum sleeve 505 includes a set of vacuum chambers 619, 621 that in one embodiment are cylindrically shaped, so circular in cross section and extending longitudinally. The vacuum chambers are connected to the grooves 519, 521, with some vacuum chambers 619 connected to the grooves 519 of the first set and other chambers 621 connected to the grooves 521 of the second set. One embodiment of the drum sleeve 505 includes eight cylindrically shaped vacuum chambers whose centers of cross section are distracted 45 degrees apart. Each of a first set of four vacuum chambers 619 is connected to each of the first set of vacuum grooves 519, and each of a second set of the vacuum chambers 621 is connected to each of the second set of vacuum grooves 521. The centers of the circular cross sections of the chambers 619 of the first set are separated by 90 degrees, and the centers of the circular cross sections of the chambers 621 of the second set are also separated by 90 degrees, with the cross section centers of first set arranged 45 degrees apart from the cross section centers of the second set.

FIG. 6B shows a cross section (Section DD) through a groove 519 of the first set and also through the end 607, and shows four tubular passageways 629 that couple the four chambers 619 to the groove 519 of the first set. FIG. 6B also shows tubular passageways 635 that are in the end 607 of the drum sleeve 505 and connect the eight chambers 619, 621 to at least one matching tubular passageway in the base body 503, and eventually to a source of vacuum when the drum sleeve 505 is mounted on the base body.

FIG. 6C shows a cross section through a groove 521 of the second set of grooves, and shows four tubular passageways 631 that couple the four chambers 621 to the groove 521 of the second set.

Each alternate groove is coupled to four of the chambers by either four tubes 629 for a groove 519 of the first set, or four tubular passageways such as tubular passageways 631 for a groove 521 of the second set.

Figure 6D:
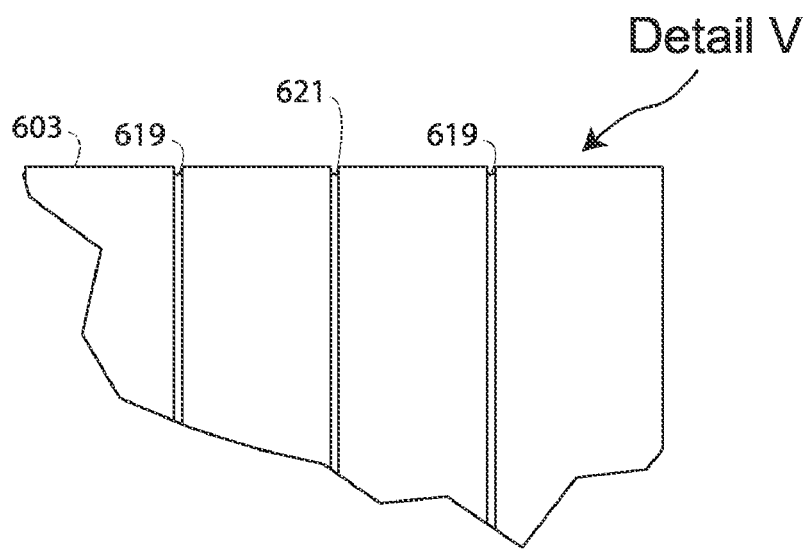
FIG. 6D shows the region marked V in FIG. 5B in more detail.

FIG. 6D shows the region marked V in FIG. 5B in more detail. In one embodiment, the grooves are about 1.2 mm wide and about 1 mm deep. In such an embodiment, the grooves are spaced about 23.7 mm apart. Of course, these dimensions should not be taken to restrict the invention, and those in the art will understand that different embodiments would have different dimensions. Such vacuum grooves are common in drums used today for mounting plates thereon, and those in the art would be familiar with such structures. Hence, details on their construction is left out of this disclosure.

Figure 6E:
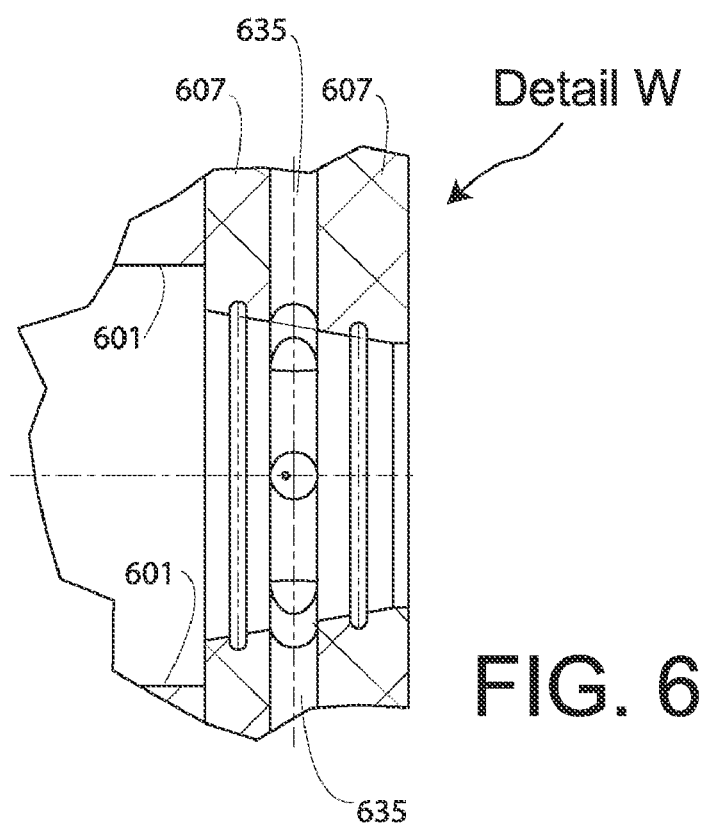
FIG. 6E shows the region marked W in FIG. 6A in more detail.

FIG. 6E shows the region marked W in FIG. 6A in more detail. Note that the scales of FIGS. 6D and 6E are not the same. FIG. 6E shows the part of end 607 that includes the tubular passageways to the eight vacuum chambers in more detail.

One embodiment of the drum sleeve 505 is constructed using an outer cylindrical tube whose outer surface is the outer surface 603, and an inner cylindrical tube whose inner surface provides the inner surface 601 that is made of an expandable material as is used in conventional sleeves that are mountable using air pressure. Eight tubes are mounted in one end 605, and the interior of these eight tubes form the vacuum chambers 619, 621. The space between the interior of the outer cylindrical tube, the outside of the inner cylindrical tube, and the outside of the eight tubes that form the vacuum chamber is filled with a filler material 633. Filler materials for use in the interior of sleeves are known in the art, so that those in the art would be familiar with such filler material. The second end 607 is attached to the combination of the outer tube, inner tube, first end 605, eight tubes, and the filler material 633 to form the drum sleeve 505. The grooves 519 and 521 are on the outside surface of the outer tubes. The passageways 629 and 631 are drilled from the grooves 519, 521 through to the respective chambers 619, 621.

Referring now back to the embodiments 503 and 505 of the base body and drum sleeve, the base body 503 forms a mandrel for sleeves or for the drum sleeve 505. The drum sleeve is mounted on the same mandrel that is used for sleeve imaging by applying compressed air to the first end 205 through the hole 211.

Figure 7:
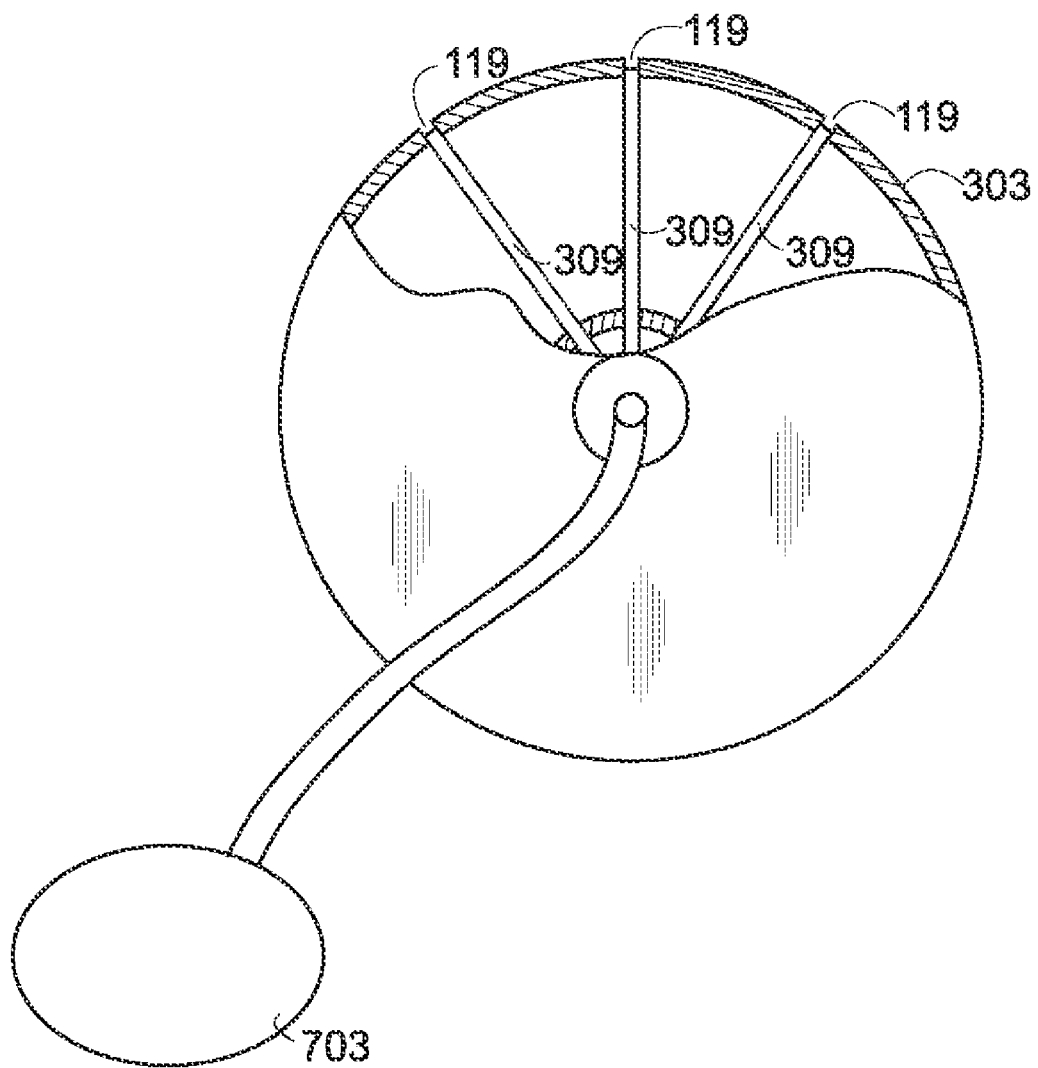
FIG. 7 shows one embodiment of a vacuum pump mounted on the second end of the base body.

FIG. 7 shows one embodiment of a vacuum pump 703 mounted on the second end 207 of the base body, and also shows a plurality of tubular passageways 309 for coupling the vacuum source 703 to grooves 119 on the outer surface 303 of the drum sleeve 103.

Figure 8:
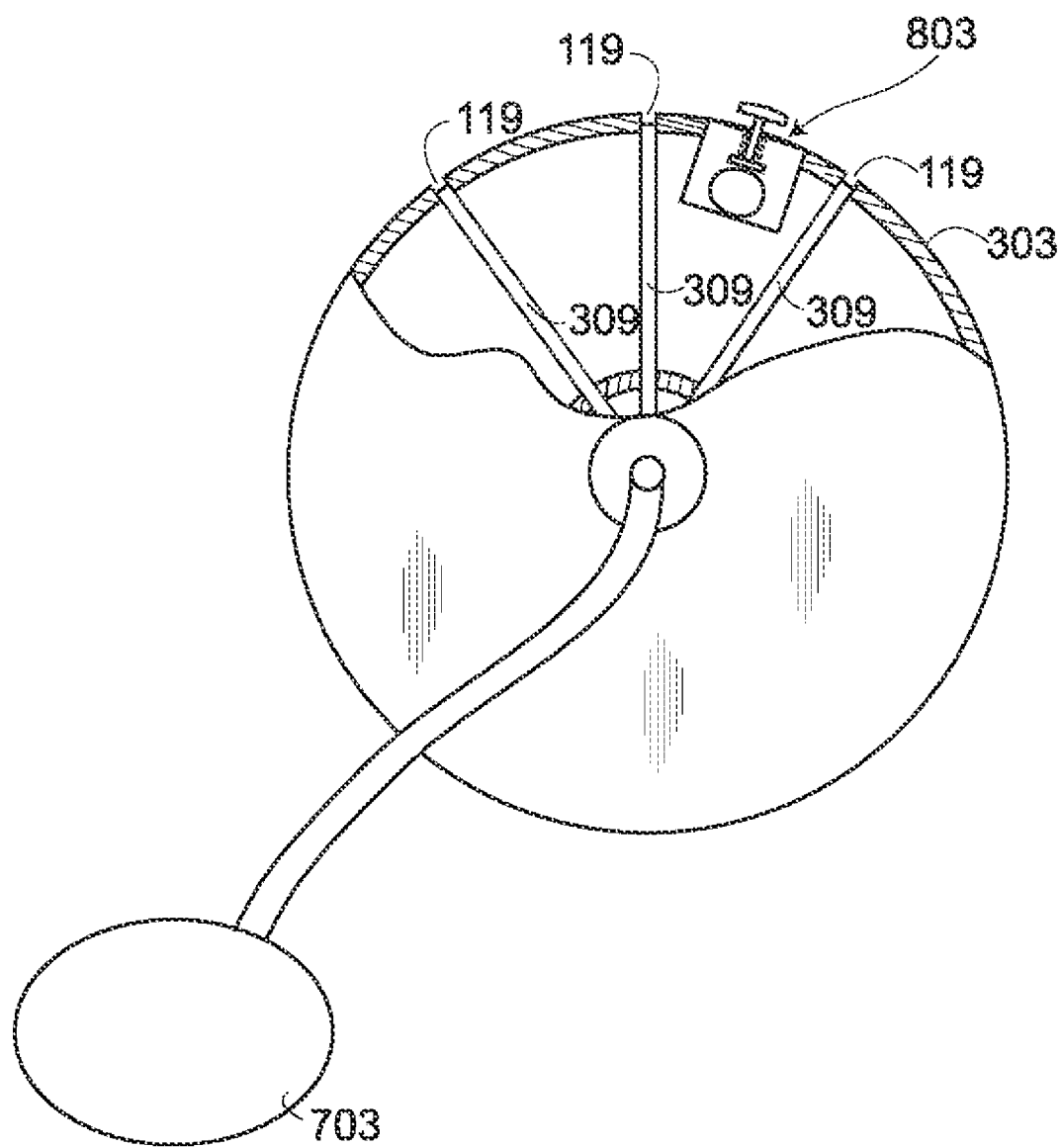
FIG. 8 shows an alternate embodiment that includes, in addition to the vacuum grooves that help mounting a plate, a clamp system that extends longitudinally and that is operable to clamp the end of a plate onto the outer surface of the drum sleeve

FIG. 8 shows an alternate embodiment that includes, in addition to the vacuum grooves that help mounting a plate, a clamp system 803 that extends longitudinally, and that is operable to clamp the end of a flexographic plate onto the surface 303 of the drum sleeve.

One embodiment of the clamping device includes a clamp system body having a hollow interior, and extending in the axial direction of the drum sleeve 105, the clamp system body being fixed to the inner part of the drum sleeve between the material providing the outer surface 303 and the material providing the inside surface 301, and close to the outside of the drum sleeve 105. The clamping device embodiment further includes a clamping element having a width and extending in the axial direction of the drum sleeve, located adjacent to the outer surface 303 of the drum sleeve where the clamp system body is located. The clamping device embodiment further includes a lifting bar located in the interior of the base body and coupled to the clamping element by at least one guiding shaft, the lifting bar being movable in a first radial direction to move the clamping element away from the outer surface 303 of the drum sleeve to form a gap between the outer surface 303 and the clamping element, the lifting bar further being movable in the radial direction opposite the first radial direction to close the gap formed between the outer surface 303 of the drum sleeve and the clamping element. The clamping device embodiment further includes a mechanism to impart and maintain compressive force between the clamping element and the outer surface of the cylinder such that any gap formed is maintained closed unless forcibly opened. The width of the clamping element is configured such that a gap formed between the clamping element and the outer surface 303 is sufficient to grip the edge of a plate when the gap is closed, such that when the gap is formed by moving the lifting bar in the first radial direction, the edge of a flexible plate can be placed in the gap, and such that when the gap is closed, the plate is clamped onto the outer surface of the drum sleeve.

One embodiment of the clamping device includes an inflatable hose arranged in the interior of the clamp system body and adapted to move the clamping device in the first radial direction when pressure is applied to inflate the inflatable hose.

In one embodiment, the mechanism to impart and maintain compressive force includes at least one spring between the lifting bar and the inner wall of the material that forms the outer surface 303 such that the spring is biased to impart and maintain the compressive force in the radial direction, and such that when the inflatable hose is inflated, a force opposite to the compressive force is applied on said lifting bar to move the clamping element in the first radial direction away from the outer surface 303 of the drum sleeve.

Those in the art will recognize that other types of clamping devices may be used.

One embodiment of the drum sleeve includes a clamping device, e.g., the clamping device described above, but no vacuum grooves.

In the embodiment described above, the fixing of a sleeve or the drum sleeve 105 onto the base body 103 is carried out using only a compressed air system.

One alternate embodiment of the base body 103 includes a sleeve clamping system, e.g., a hydraulic sleeve clamping system arranged to fix sleeves onto the base body 103, and in particular, arranged to clamp the drum sleeve 105 onto the base body 103 once the drum sleeve 105 is mounted on the base body 103. The hydraulic clamp system is located at the first and the second ends 305, 307 of the base body 103, and includes radially expansible elements. A sleeve or the sleeve drum 105 is mounted onto the base body 103. To fix the sleeve or drum sleeve 105, elements that are arranged circularly around the base body expand radially to form a larger outer diameter. The extended outer diameter clamps the sleeve or drum sleeve 105 to fix it onto the base body until the clamp system releases the sleeve or drum sleeve 105.

In one embodiment, the fixing of a sleeve or the drum sleeve 105 onto the base body 103 is carried out using only a sleeve clamping system without the compressed air system.

In another embodiment, the fixing of a sleeve or the drum sleeve 105 onto the base body 103 is carried out using a compressed air system in combination with a sleeve clamping system.

Thus, a base body that is adapted to accept either sleeves or a drum sleeve is described, the drum sleeve adapted for mounting plates thereon. Also a drum sleeve has been described that is adapted for mounting plates thereon, and that is mountable on a base body instead of, and in the same manner as a sleeve.

Unless specifically stated otherwise, as apparent from the following discussions, it is appreciated that throughout the specification discussions utilizing terms such as "processing," "computing," "calculating," "determining" or the like, refer to the action and/or processes of a computer or computing system, or similar electronic computing device, that manipulate and/or transform data represented as physical, such as electronic, quantities into other data similarly represented as physical quantities.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the above description of example embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

As used herein, unless otherwise specified the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

All publications, patents, and patent applications cited herein are hereby incorporated by reference.

Any discussion of prior art in this specification should in no way be considered an admission that such prior art is widely known, is publicly known, or forms part of the general knowledge in the field.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting only of elements A and B. Any one of the terms including or which includes or that includes as used herein is also an open term that also means including at least the elements/features that follow the term, but not excluding others. Thus, including is synonymous with and means comprising.

Similarly, it is to be noticed that the term coupled, when used in the claims, should not be interpreted as being limitative to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

We claim:

1. An apparatus comprising:

a generally cylindrically-shaped base body having a cylindrically-shaped outer surface, the base body being rotatable around an axis of rotation;

a compressed air system coupled to the base body and switchable between an on state during which air pressure is applied outward from the base body's outer surface and an off state during which no air pressure is applied outward from the base body's outer surface;

a cylindrically-shaped tube at most as long as the base body and having a generally cylindrically-shaped inner surface defining a hollow region, a cylindrically-shaped outer surface, a first end, and a second end, the tube's inner surface configured to have a diameter relative to the diameter of the base body's outer surface such that when the tube is on the base body, and the compressed air system is in the off state, the base body's outer surface that is covered by the tube makes mechanical contact with the tube's inner surface to temporarily secure the tube to the base surface and when the compressed air system is in the on state, the tube inner surface is expanded so that the tube can be mounted onto and unmounted from base body, such that when the tube is secured to the base surface with the compressed air system off, and the base body rotated, the tube also rotates, the tube further including one or more mechanisms around the outer surface of the tube arranged to secure and unsecure a flexible sheet of material wrapped around the outer surface of the tube, the one or more mechanisms including one or both of (i) vacuum grooves or holes coupled when the tube is secured on the base body to a vacuum system connected to the base body, and (ii) a clamp system that extends longitudinally, and that is operable to clamp an end of the sheet onto the outer surface of the tube, the tube being configured such that when the tube is secured to the base body with the compressed air system off and the sheet is secured on the outer surface of the tube, the tube, base body, and sheet combination is rotatable and the sheet can be exposed by an exposing mechanism in the case that the base body is part of a drum imager that includes the exposing mechanism and the sheet is a sensitized sheet for exposing, or scanned by a scanning mechanism in the case that the base body is part of a drum scanner that includes the scanning mechanism and the sheet is a sheet for scanning, the tube further being configured to be removable from the base body as part of normal operation for example after the exposing or scanning, the base body being configured such that different tubes may be mounted thereon and unmounted therefrom as part of normal operation.

2. An apparatus as recited in claim 1, wherein the one or more mechanisms around the outer surface of the cylindrically shaped tube include vacuum grooves arranged to help maintain the sheet on the outer surface by applying suction to the vacuum grooves.

3. An apparatus as recited in claim 2, wherein the vacuum grooves include longitudinal grooves extending longitudinally along the outer surface of the tube.

4. An apparatus as recited in claim 2, wherein the one or more mechanisms around the outer surface of the cylindrically shaped tube further include a clamp system that extends longitudinally, and that is operable to clamp an end of the sheet onto the outer surface of the tube.

5. An apparatus as recited in claim 2, wherein the tube includes a plurality of vacuum chambers extending longitudinally in the inner region between the outer surface of the tube, the inner surface, and first end and the second end is essentially empty, and wherein the vacuum grooves includes passageways to the vacuum chambers, such that suction is applied to the vacuum grooves by applying suction to the vacuum chambers.

6. An apparatus as recited in claim 2, wherein the vacuum grooves include circumferential grooves around the circumference of the outer surface of the tube.

7. An apparatus as recited in claim 1, wherein the inner region between the outer surface of the tube, the inner surface, and first end and the second end is substantially empty.

8. An apparatus as recited in claim 7, wherein the substantially empty inner region includes disks for structural support, the disks arranged perpendicular to the axis of rotation.

9. An apparatus as recited in claim 1, wherein the one or more mechanisms around the outer surface of the generally cylindrically shaped tube include a clamp system that extends longitudinally, and that is operable to clamp an end of the sheet onto the outer surface of the tube.

10. An apparatus comprising:
a single generally cylindrically-shaped base body has an outer surface and rotatable around an axis of rotation and configured such that one of a set of cylindrically-shaped tubes is mountable thereon, securable thereon, and unmountable therefrom as part of normal operation, each of the set of tubes having a cylindrically-shaped inner surface defining a hollow region, a cylindrically-shaped outer surface, a first end, and a second end, and being no longer than the base body;
a switchable source of air pressure configured to apply air pressure outwards from the outer surface of the base body, switchable between an on state during which the switchable source of air pressure applies air pressure outwards from the outer surface of the base body and an off state during which no air pressure is applied outwards from the outer surface of the base body;
a particular tube of the set of tubes, the particular tube being no longer than the base body, the particular tube having its inner surface configured to have a diameter relative to the diameter of the base body's outer surface such that when the particular tube is on the base body, and the switchable source of air pressure is in the off state, the base body's outer surface that is covered by the particular tube makes mechanical contact with the tube's inner surface to secure the tube to the base surface and when the switchable source of air pressure is in the on state, the particular tube inner surface is expanded so that the particular tube can be mounted onto and unmounted from the base body, such that when the particular tube is secured to the base surface with the compressed air system off, and the base body rotated, the tube also rotates;

wherein the particular tube includes on its outer surface one or both of (i) vacuum grooves or holes coupled when the particular tube is secured on the base body to a vacuum system connected to the base body and arranged to secure and unsecure a flexible sheet of material wrapped around the outer surface of the particular tube, and (ii) a clamp system that extends longitudinally, and that is operable to clamp an end of a flexible sheet of material sheet onto the outer surface of the tube such that the flexible sheet of material can be securely wrapped around the outer surface of the particular tube, the apparatus further comprising:
a rotator for rotating the base body, such that after the particular tube is temporarily secured on the base body and the sheet is secured on the outer surface of the particular tube, the particular tube, base body, and sheet combination is rotatable by the rotator and the sheet can be exposed by an exposing mechanism in the case that the base body and the rotator are part of a drum imager that includes the exposing mechanism and the sheet is a sensitized sheet for exposing, or scanned by a scanning mechanism in the case that the base body and the rotator are part of a drum scanner that includes the scanning mechanism and the sheet is a sheet for scanning, and such that after the imaging or scanning, the particular tube can be removed from the base body as part of ordinary operation by unsecuring the particular tube from the base body including switching the switchable source of air pressure to the on state, the base body being configured such that different tubes may be mounted thereon and unmounted therefrom as part of normal operation.

11. An apparatus as recited in claim 10, including a sleeve clamping system arranged to clamp the generally hollow, cylindrically-shaped tube onto the base body once the tube is mounted on the base body.

12. An apparatus comprising:
a single generally cylindrically-shaped base body having an outer surface, the base body being rotatable around an axis of rotation and configured such that a cylindrically-shaped tube can be mounted thereon and unmounted therefrom; and
a cylindrically-shaped tube configured to be mounted on and unmounted from the base body, the tube having a generally cylindrically-shaped inner surface defining a hollow region, a cylindrically-shaped outer surface, a first end, a second end, and one or more mechanisms around the outer surface of the tube arranged to secure and unsecure a flexible sheet of material wrapped around the outer surface of the tube, the inner surface of the tube configured to fit over the outer surface of the base body such that the hollow region of the tube has the base body therein when the tube is mounted on the base body, the tube being no longer than the base body, the tube having its inner surface configured to have a diameter relative to the diameter of the base body's outer surface such that when air pressure is applied from the base body's outer surface and the tube's inner surface is placed over the base body's outer surface, the tube's inner surface is expanded so that the tube can be mounted onto and unmounted from the base body, and further, when the tube's inner surface covers the base body's outer surface, and no air pressure is applied outwards from the base body's outer surface, the part of the base body's outer surface that is covered by the particular tube makes mechanical contact with the tube's inner surface and the tube is secured to the base body such that rotating the base body causes the tube to rotate;

such that the tube when mounted is temporarily securable to the base body, such that, after the securing of the tube to the base body, the inner surface of the tube covers and is mechanically coupled to the outer surface of the base body and the apparatus comprising the combination of the base body and tube mounted and secured thereon is rotatable around the axis of rotation, and such that after the sheet is secured on the outer surface of the tube, the tube, base body, and sheet combination is rotatable and the sheet can be exposed by an exposing mechanism in the case that the base body is part of a drum imager that includes the exposing mechanism and the sheet is a sensitized sheet for exposing, or scanned by a scanning mechanism in the case that the base body is part of a drum scanner that includes the scanning mechanism and the sheet is a sheet for scanning, the base body and tube further being configured such that the tube is removable from the base body as part of normal operation for example after the exposing or scanning, the base body being configured such that different tubes may be mounted thereon and unmounted therefrom as part of normal operation, wherein the one or more mechanisms around the outer surface of the generally cylindrically shaped tube include at least one of:

A) vacuum grooves arranged to help maintain the sheet on the outer surface by applying suction to the vacuum grooves, and
B) a clamp system that extends longitudinally, and that is operable to clamp an end of the sheet onto the outer surface of the tube.

13. An apparatus as recited in claim 12, wherein the one or more mechanisms around the outer surface of the cylindrically shaped tube include vacuum grooves arranged to help maintain the sheet on the outer surface by applying suction to the vacuum grooves.

14. An apparatus as recited in claim 13, wherein the tube includes a plurality of vacuum chambers extending longitudinally in the inner region between the outer surface of the tube, the inner surface, and first end and the second end is essentially empty, and wherein the vacuum grooves includes passageways to the vacuum chambers, such that suction is applied to the vacuum grooves by applying suction to the vacuum chambers.

15. An apparatus as recited in claim 12, wherein the one or more mechanisms around the outer surface of the generally cylindrically shaped tube include a clamp system that extends longitudinally, and that is operable to clamp an end of the sheet onto the outer surface of the tube.

16. A method comprising:
mounting a cylindrically-shaped tube configured on a single generally cylindrically-shaped base body rotatable around an axis of rotation, the base body having an outer surface, being rotatable around an axis of rotation and configured such that one of a set of cylindrically-shaped tubes is mountable thereon and unmountable therefrom, the tube having a generally cylindrically-shaped inner surface defining a hollow region, and a cylindrically-shaped outer surface, the inner surface of the tube configured to fit over the outer surface of the base body, the base body being at least as long as the tube, the tube further including one or more mechanisms around the outer surface of the tube arranged to secure and unsecure a flexible sheet of material wrapped around the outer surface of the tube, the base body having a switchable source of air pressure coupled thereto configured to apply air pressure outwards from the outer surface of the base body, switchable between an on state during which the switchable source of air pressure applies air pressure outwards from the outer surface of the base body and an off state during which no air pressure is applied outwards from the outer surface of the base body, the tube being configured to have a diameter relative to the diameter of the base body's outer surface such that when the tube is on the base body, and the switchable source of air pressure is in the off state, the base body's outer surface that is covered by the tube makes mechanical contact with the tube's inner surface to secure the tube to the base surface and when the switchable source of air pressure is in the on state, the tube inner surface is expanded so that the tube can be mounted onto and unmounted from base body, the mounting including switching the source of air pressure to the on state, wherein the tube includes on its outer surface one or both of (i) vacuum grooves or holes coupled when the particular tube is secured on the base body to a vacuum system connected to the base body and arranged to secure and unsecure a flexible sheet of material wrapped around the outer surface of the particular tube, and (ii) a clamp system that extends longitudinally, and that is operable to clamp an end of a flexible sheet of material sheet onto the outer surface of the tube such that the flexible sheet of material can be securely wrapped around the outer surface of the particular tube;

wrapping a flexible sheet of material around the outer surface of the tube, and securing the sheet onto the outer surface by one or both of applying vacuum to the vacuum grooves or holes in the case the vacuum grooves or holes are included, and clamping one end of the flexible sheet of material sheet onto the outer surface in the case the claim system is included;

temporarily securing the tube on the base body, including switching the source of air pressure to the off state, such that the inner surface covers and is mechanically coupled to the outer surface of the base body, and such that when the base body is rotated, the tube also rotates;

rotating the tube, base body, and sheet combination to either expose the sheet by an exposing mechanism in the case that the base body is part of a drum imager that includes the exposing mechanism and the sheet is a sensitized sheet for exposing, or to scan the sheet by a scanning mechanism in the case that the base body is part of a drum scanner that includes the scanning mechanism and the sheet is a sheet for scanning, unsecuring the tube from base body and removing the tube from the base body, including switching the source of air pressure to the on state;

wherein the base body is configured such that different tubes may be mounted thereon and unmounted therefrom as part of normal operation.

* * * * *